United States Patent
Liu et al.

(10) Patent No.: US 8,779,476 B2
(45) Date of Patent: Jul. 15, 2014

(54) ASYMMETRIC WEDGE JFET, RELATED METHOD AND DESIGN STRUCTURE

(71) Applicant: International Business Machines Corporation, Armonk, NY (US)

(72) Inventors: Xuefeng Liu, South Burlington, VT (US); Richard A. Phelps, Colchester, VT (US); Robert M. Rassel, Colchester, VT (US); Xiaowei Tian, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/870,286

(22) Filed: Apr. 25, 2013

(65) Prior Publication Data
US 2013/0299881 A1    Nov. 14, 2013

Related U.S. Application Data

(62) Division of application No. 12/888,828, filed on Sep. 23, 2010, now Pat. No. 8,481,380.

(51) Int. Cl.
*H01L 29/80*    (2006.01)

(52) U.S. Cl.
USPC .................................. 257/256; 257/E27.069

(58) Field of Classification Search
USPC .................... 257/272, 274, E27.069, 256, 263
See application file for complete search history.

(56) References Cited

U.S. PATENT DOCUMENTS

| | | | |
|---|---|---|---|
| 3,841,917 A * | 10/1974 | Shannon | 438/186 |
| 4,185,291 A * | 1/1980 | Hirao et al. | 257/285 |
| 5,008,719 A * | 4/1991 | Schrantz | 257/261 |
| 7,335,952 B2 * | 2/2008 | Tanaka | 257/350 |
| 7,348,228 B2 | 3/2008 | Wu | |
| 7,518,189 B1 | 4/2009 | Hackler, Sr. et al. | |
| 7,781,809 B2 * | 8/2010 | Knaipp | 257/285 |
| 7,825,441 B2 | 11/2010 | Eshun et al. | |
| 7,989,853 B2 | 8/2011 | Hao et al. | |
| 8,093,633 B2 * | 1/2012 | Poenar et al. | 257/257 |
| 2007/0029573 A1 | 2/2007 | Cheng et al. | |
| 2007/0200117 A1 * | 8/2007 | Kumar et al. | 257/77 |

(Continued)

OTHER PUBLICATIONS

S. J. Kim et al., "A low-power high-speed ion-implanted JFET for InP-based monolithic optoelectronic IC's." IEEE Electron Device Letters, 1987, vol. 8, No. 11, pp. 518-520.

(Continued)

*Primary Examiner* — Daniel Luke
*Assistant Examiner* — Latanya N Crawford
(74) *Attorney, Agent, or Firm* — Anthony J. Canale; Hoffman Warnick LLC

(57) ABSTRACT

A junction gate field-effect transistor (JFET) for an integrated circuit (IC) chip is provided comprising a source region, a drain region, a lower gate, and a channel, with an insulating shallow trench isolation (STI) region extending from an inner edge of an upper surface of the source region to an inner edge of an upper surface of the drain region, without an intentionally doped region, e.g., an upper gate, coplanar with an upper surface of the IC chip between the source/drain regions. In addition, an asymmetrical quasi-buried upper gate can be included, disposed under a portion of the STI region, but not extending under a portion of the STI region proximate to the drain region. Embodiments of this invention also include providing an implantation layer, under the source region, to reduce $R_{on}$. A related method and design structure are also disclosed.

17 Claims, 16 Drawing Sheets

(56) References Cited

U.S. PATENT DOCUMENTS

| | | | |
|---|---|---|---|
| 2008/0074908 A1* | 3/2008 | Chang et al. | 363/49 |
| 2008/0090346 A1 | 4/2008 | Chen et al. | |
| 2008/0197446 A1 | 8/2008 | Disney et al. | |
| 2008/0230812 A1 | 9/2008 | Disney et al. | |
| 2008/0237783 A1 | 10/2008 | Williams et al. | |
| 2008/0238519 A1* | 10/2008 | Kapoor | 327/297 |
| 2008/0251818 A1 | 10/2008 | Hao et al. | |
| 2008/0272408 A1 | 11/2008 | Vora | |
| 2008/0308838 A1 | 12/2008 | McNutt et al. | |
| 2008/0315266 A1 | 12/2008 | Eshun et al. | |
| 2009/0039398 A1* | 2/2009 | Hatamoto et al. | 257/272 |
| 2009/0075435 A1 | 3/2009 | Vora | |
| 2009/0101941 A1* | 4/2009 | Ellis-Monaghan et al. | 257/270 |
| 2009/0109781 A1* | 4/2009 | Bernstein et al. | 365/222 |
| 2009/0302355 A1 | 12/2009 | Pekarik et al. | |
| 2010/0032729 A1* | 2/2010 | Hao et al. | 257/272 |
| 2010/0133441 A1 | 6/2010 | Aurola | |
| 2010/0207173 A1 | 8/2010 | Anderson et al. | |
| 2010/0271133 A1 | 10/2010 | Bracale et al. | |
| 2010/0301922 A1* | 12/2010 | Simin et al. | 327/434 |
| 2011/0284930 A1 | 11/2011 | Hershberger et al. | |

OTHER PUBLICATIONS

S. J. Kim et al., "Fully ion-implanted InP JFET with buried p-layer," IEEE Electron Device Letters, vol. 11, No. 1, Jan. 1990, pp. 57-58.

D. Caputo et al., "Low pinch-off voltage amorphous silicon junction field-effect transistor," IEEE Trans. on Elec. Dev., vol. 50, No. 6, Jun. 2003, pp. 1559-1561.

S. K. Saha, "Source-Drain Engineering for Sub-90 nm Junction-Field-Effect Transistors," IEDST '09, Jun. 1-2, 2009, pp. 1-6.

Crawford, Office Action Communication for U.S. Appl. No. 12/888,828 dated Aug. 31, 2012, 13 pages.

Crawford, Notice of Allowance and Fee(s) Due for U.S. Appl. No. 12/888,828 dated Mar. 4, 2013, 7 pages.

* cited by examiner

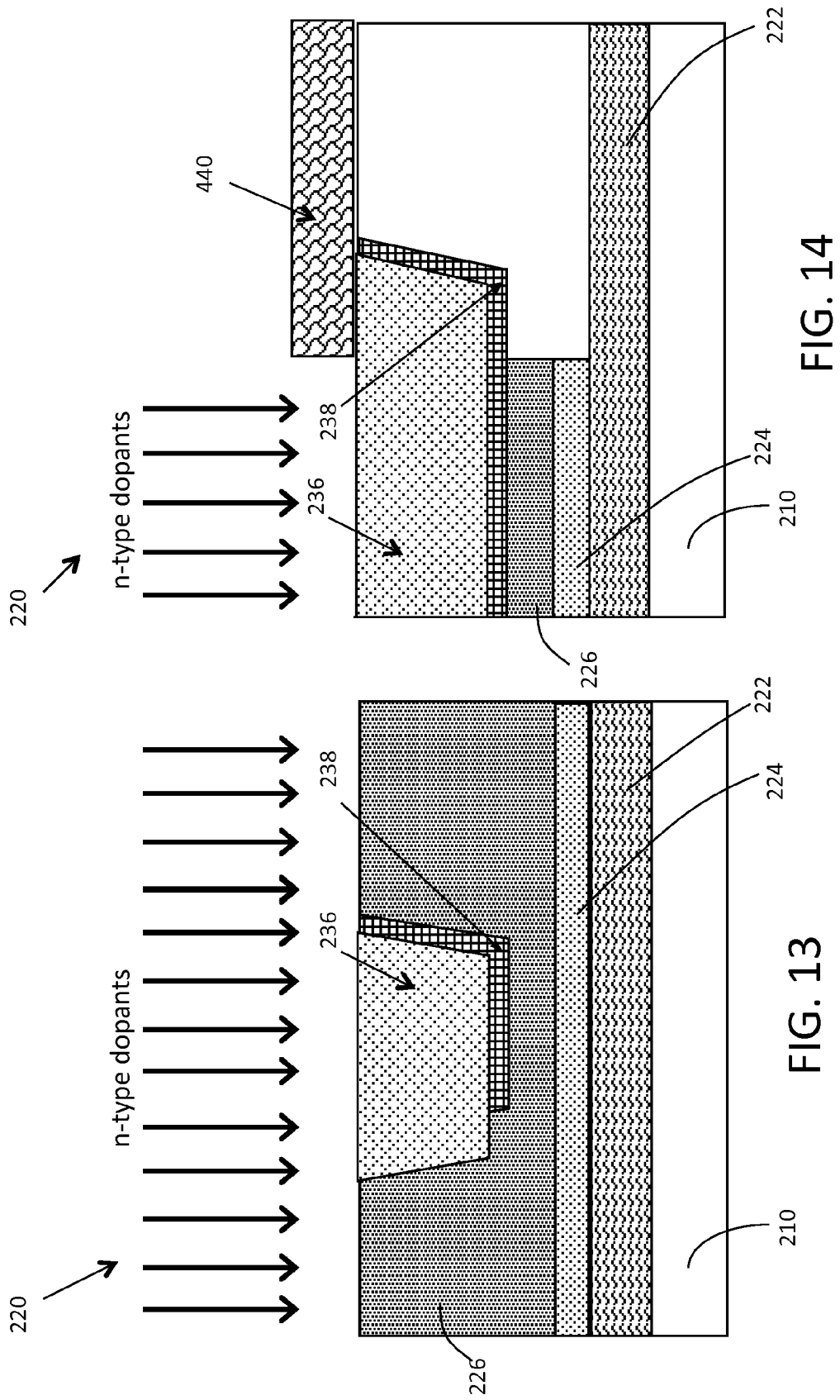

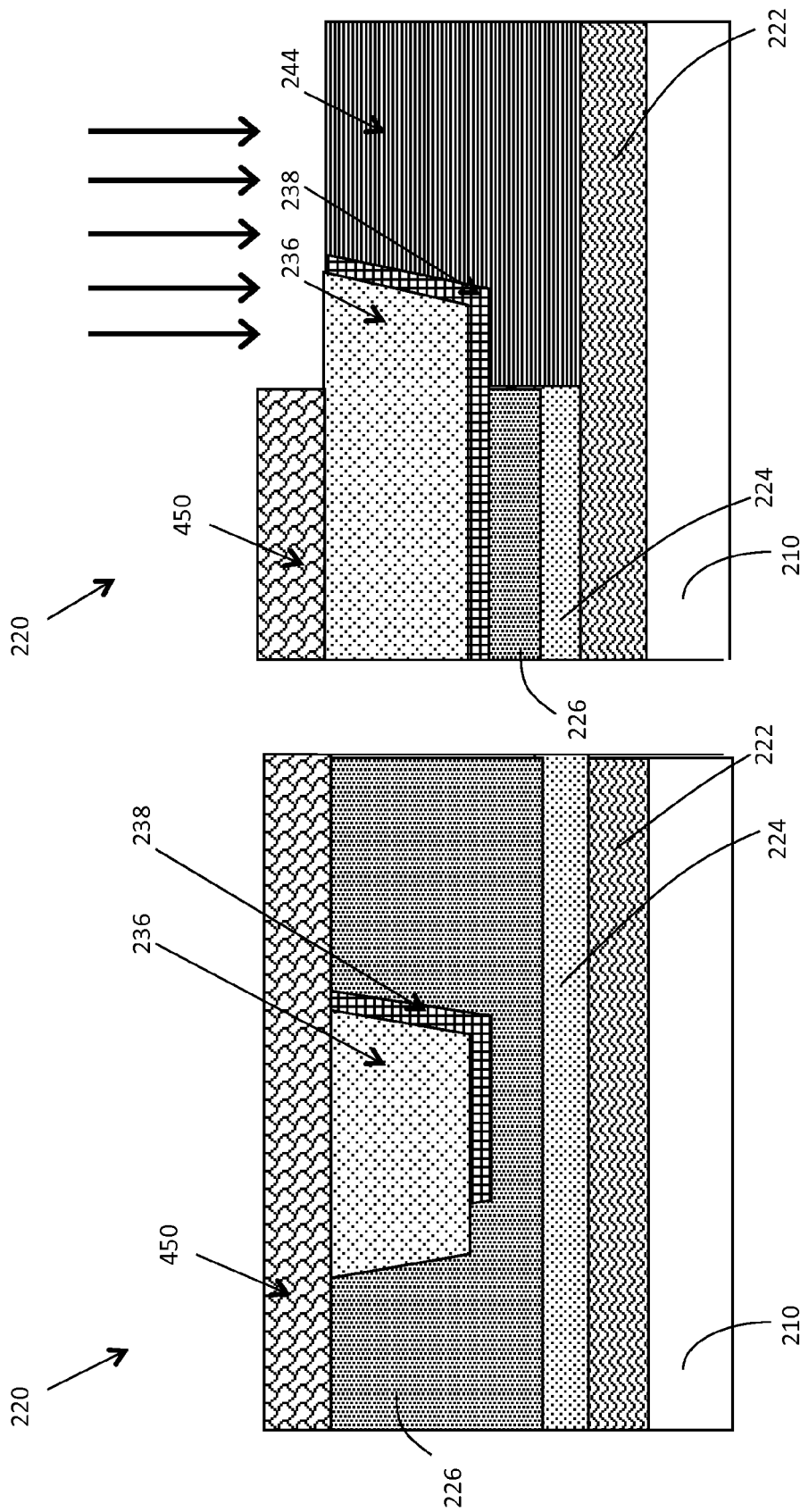

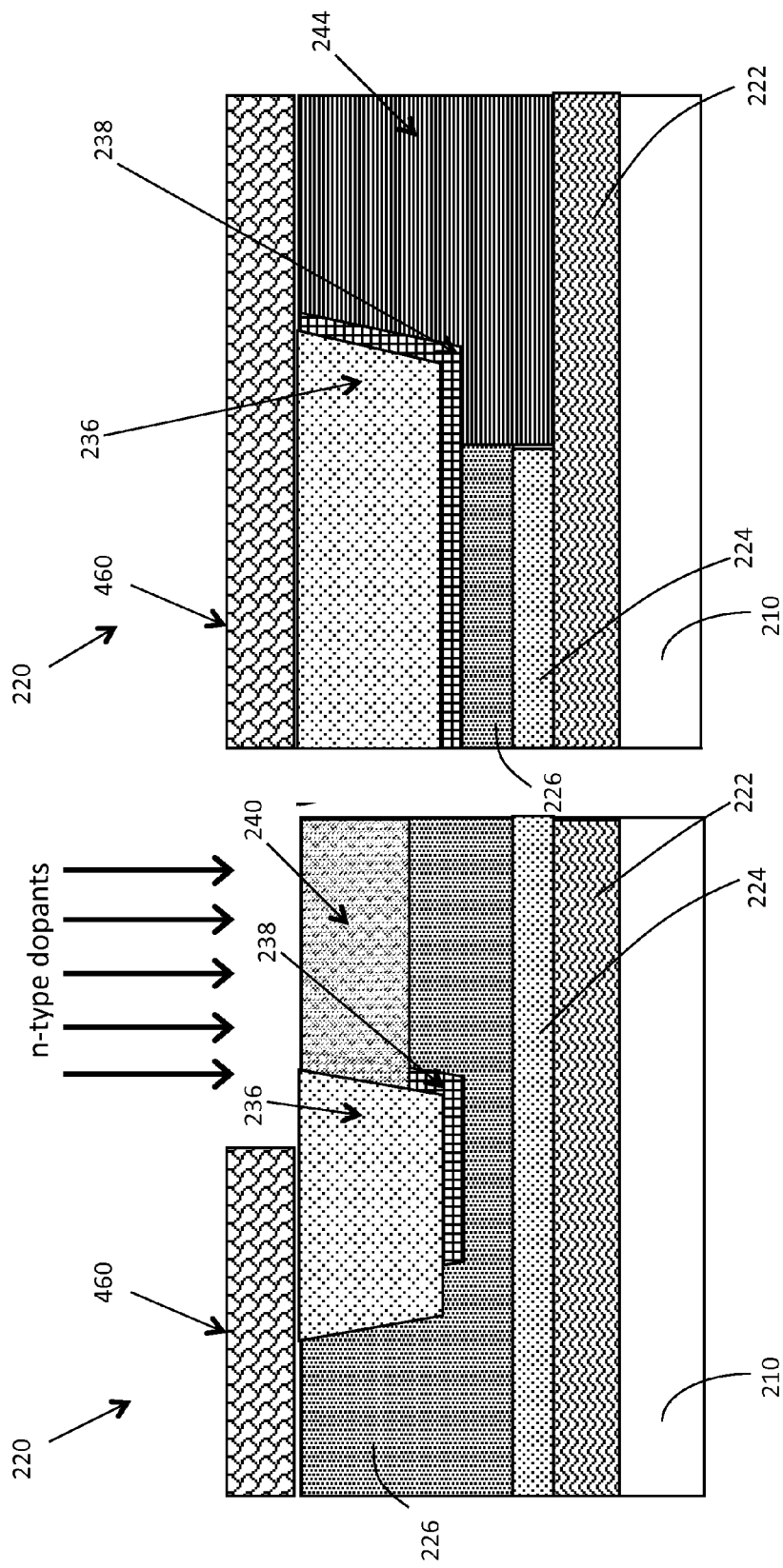

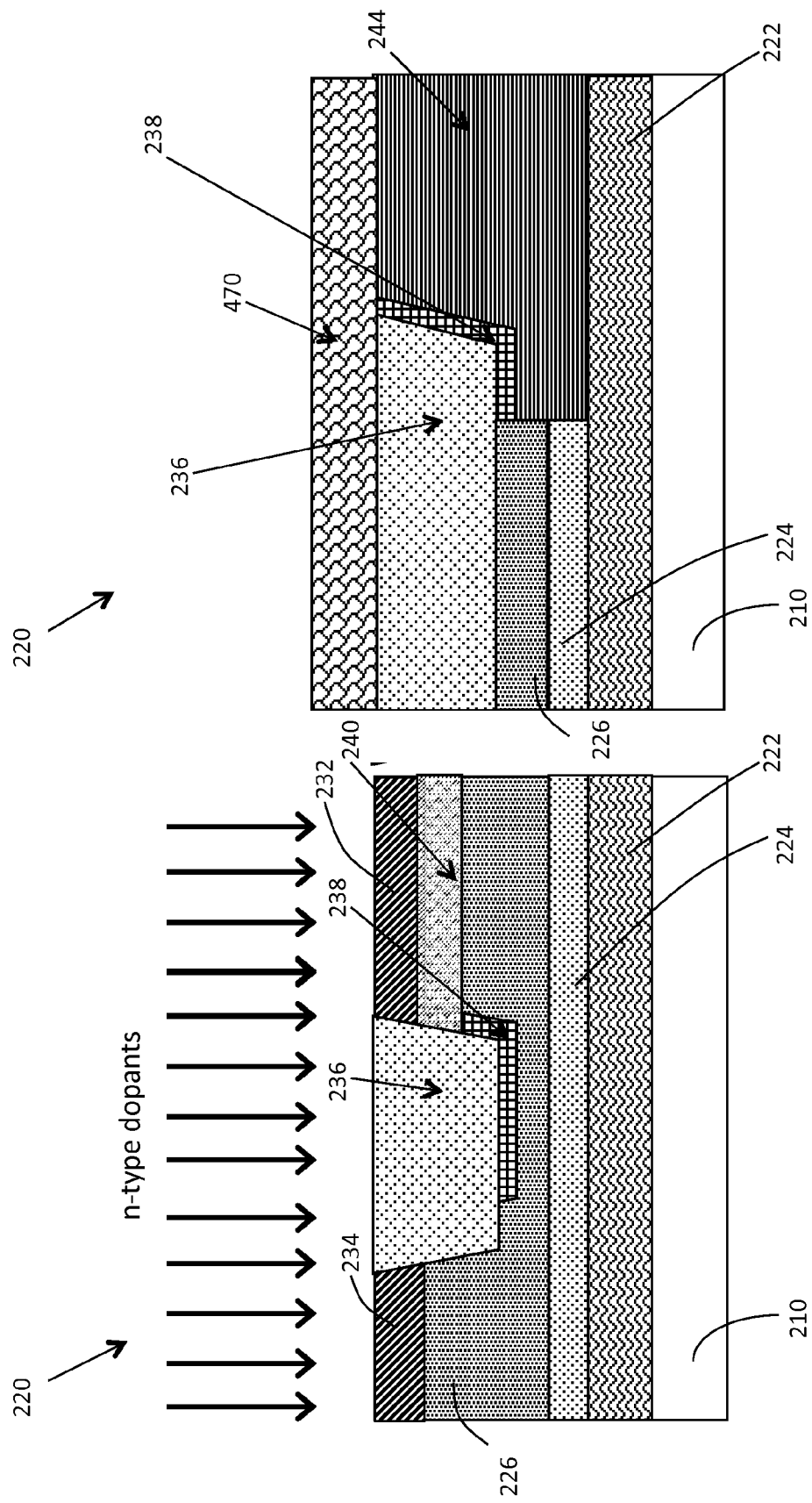

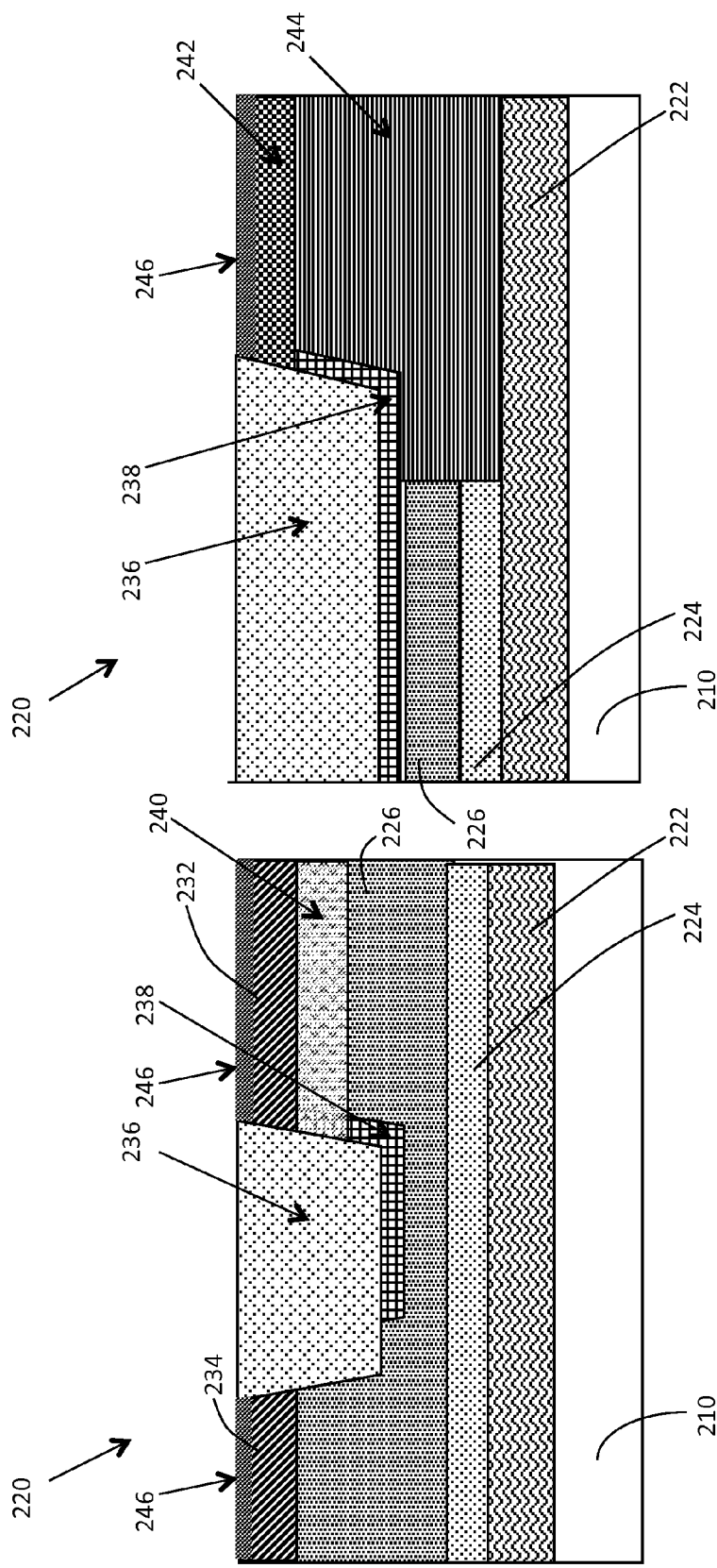

ASYMMETRIC WEDGE JFET, RELATED METHOD AND DESIGN STRUCTURE

CROSS-REFERENCE TO RELATED APPLICATIONS

This application is a divisional of currently pending U.S. patent application Ser. No. 12/888,828 filed on Sep. 23, 2010. The application identified above is incorporated herein by reference in its entirety for all that it contains in order to provide continuity of disclosure.

TECHNICAL FIELD

Embodiments of this invention relate generally to integrated circuit chips and, more particularly, to a chip including an asymmetric wedge junction gate field-effect transistor (JFET), a related method and design structure.

BACKGROUND

Typically, in semiconductor chip applications, in a field effect transistor (FET), such as a junction gate field-effect transistor (JFET), there is a relationship between the pinchoff voltage $V_p$ (the gate voltage at which the device will no longer conduct between the source and drain) and the on resistance $R_{on}$ (the linear relationship between drain to source voltage and drain current for low drain to source voltage). Specifically, current methods of reducing $R_{on}$ have the effect of increasing $V_p$. Therefore, it is difficult to fabricate a JFET device with a low $V_p$ while maintaining a low $R_{on}$. In technologies with deep shallow trench isolations (STIs) and shallow diffusions, it is difficult to construct a standard JFET with a low $R_{on}$ and low $V_p$. This is typically due to the fact that the JFET channel must extend underneath the STI and therefore the shallower gate junction provides less impact (or no contribution) to turning off the device (i.e., $V_p$).

BRIEF SUMMARY

A junction gate field-effect transistor (JFET) for an integrated circuit (IC) chip is provided comprising a source region, a drain region, a lower gate, and a channel, with an insulating shallow trench isolation (STI) region extending from an inner edge of an upper surface of the source region to an inner edge of an upper surface of the drain region, without an intentionally doped region, e.g., an upper gate, coplanar with an upper surface of the IC chip between the source/drain regions. In addition, an asymmetrical quasi-buried upper gate can be included, the quasi-buried upper gate disposed under a portion of the STI region, but not extending under a portion of the STI region proximate to the drain region. Embodiments of this invention also include providing an implantation layer, under the source region, to reduce $R_{on}$. A related method and design structure are also disclosed.

A first aspect of the disclosure provides junction field effect transistor (JFET) having an upper surface, the JFET comprising: a source region having an upper surface substantially coplanar with the upper surface of the JFET, the upper surface of the source region having an inner edge and an outer edge; a drain region having an upper surface substantially coplanar with the upper surface of the JFET, the upper surface of the drain region having an inner edge and an outer edge; a channel region disposed under the source region and the drain region; and a shallow trench isolation (STI) region comprising an insulator material, the STI region having an upper surface substantially coplanar with the upper surface of the JFET, the upper surface of the STI region extending from the inner edge of the source region to the inner edge of the drain region.

A second aspect of the disclosure provides a method of forming a junction field effect transistor (JFET), the method comprising: forming a trench in the substrate, the trench having a substantially horizontal bottom surface, a substantially vertical first side and a substantially vertical second side; forming a quasi-buried upper gate below the trench; filling the trench with an insulator material to create a shallow trench isolation (STI) region, wherein the quasi-buried upper gate is disposed under a portion of the STI region such that the quasi-buried upper gate does not extend along a portion of the STI region proximate to the second side of the trench; forming a lower gate region below the STI region; forming a channel region disposed between the lower gate and the STI region; forming a source region adjacent to the first side of the trench; and forming a drain region adjacent to the second side of the trench.

A third aspect of the invention provides a final design structure instantiated in a machine readable medium for designing and manufacturing a circuit, the final design structure comprising machine readable instructions for manufacturing at least one circuit and an integrated circuit, the circuit comprising: a junction field effect transistor (JFET) including: a source region having an upper surface substantially coplanar with the upper surface of the JFET, the upper surface of the source region having an inner edge and an outer edge; a drain region having an upper surface substantially coplanar with the upper surface of the JFET, the upper surface of the drain region having an inner edge and an outer edge; a channel region disposed under the source region and the drain region; and a shallow trench isolation (STI) region comprising an insulator material, the STI region having an upper surface substantially coplanar with the upper surface of the JFET, the STI region extending from the inner edge of the source region to the inner edge of the drain region.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

FIGS. 7-24 show a method of forming a JFET according to embodiments of the invention.

Figure 1:
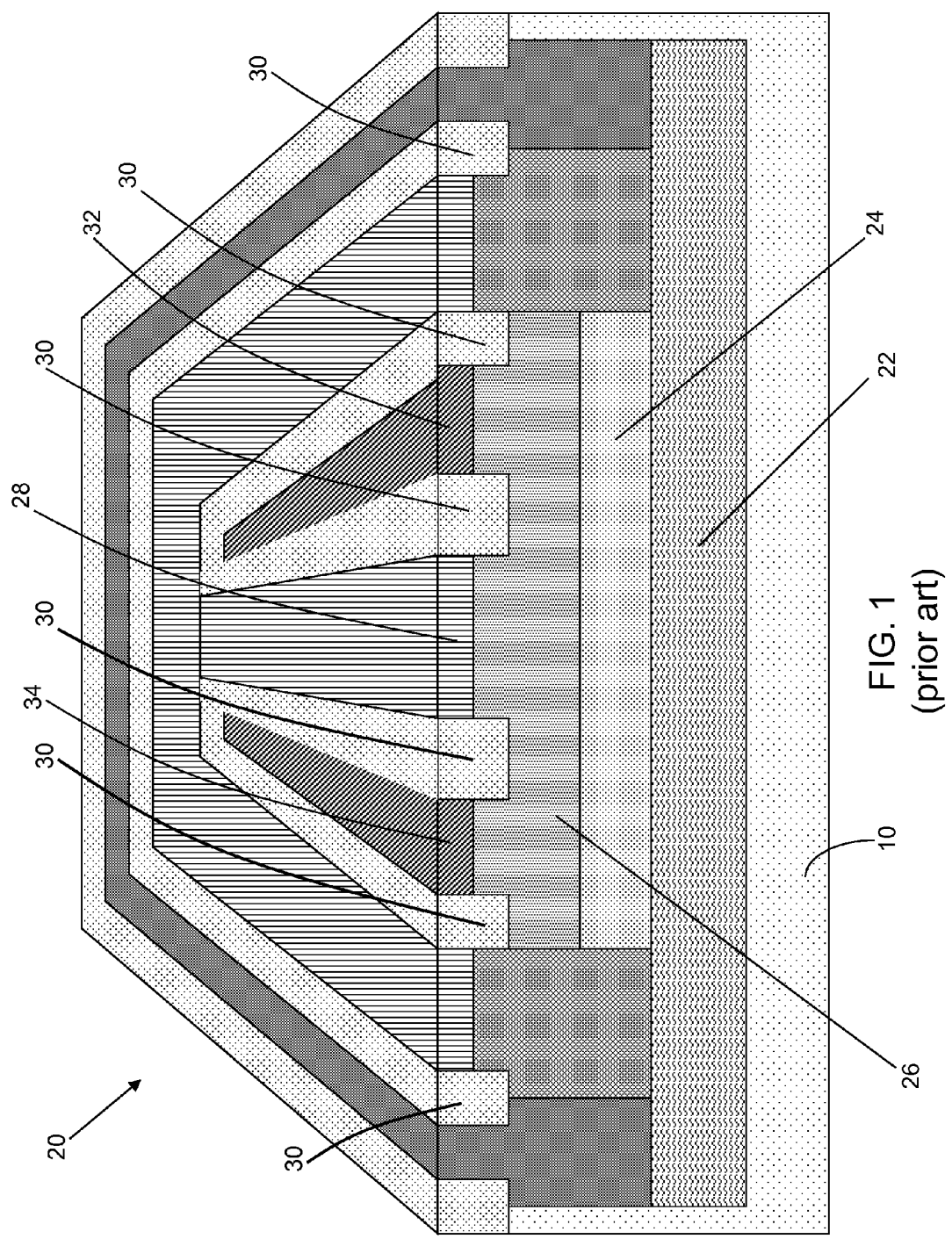
FIG. 1 shows a junction gate field-effect transistor (JFET) as known in the art.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

FIG. 1 shows a junction gate field effect transistor (JFET) 20 incorporated into substrate 10 of an integrated circuit (IC)

chip (partially shown) as known in the art. JFET 20 can include a deep doped region 22, a lower gate 24, a channel region 26, an upper gate 28 and a plurality of shallow trench isolation (STI) regions 30. JFET 20 further includes a source region 32 and a drain region 34. As is known in the art, the depth of deep doped region 22, lower gate 24 and channel region 26 can be adjusted as desired.

It is understood that when forming JFET 20, regardless of the depth of each layer, each adjacent layer is intentionally doped with an opposite polarity, i.e., n-type dopants such as phosphorous (P), arsenic (As) or antimony (Sb), or p-type dopants such as boron (B), indium (In) or gallium (Ga), in order to ensure that there is little to no conduction between the layers. For example, if deep doped region 22 is doped with n-type dopants, lower gate 24 would be doped with p-type dopants, channel region 26 would be doped with n-type dopants, and upper gate 28 would be doped with p-type dopants.

As is shown in FIG. 1, traditional JFETs, such as JFET 20, include an upper gate 28 that has an upper surface that is coplanar with an upper surface of substrate 10, between source region 32 and drain region 34, with at least a first STI region 30 separating source region 32 from upper gate 28, and a second STI region 30 separating source region 34 from upper gate 28.

Figure 2:
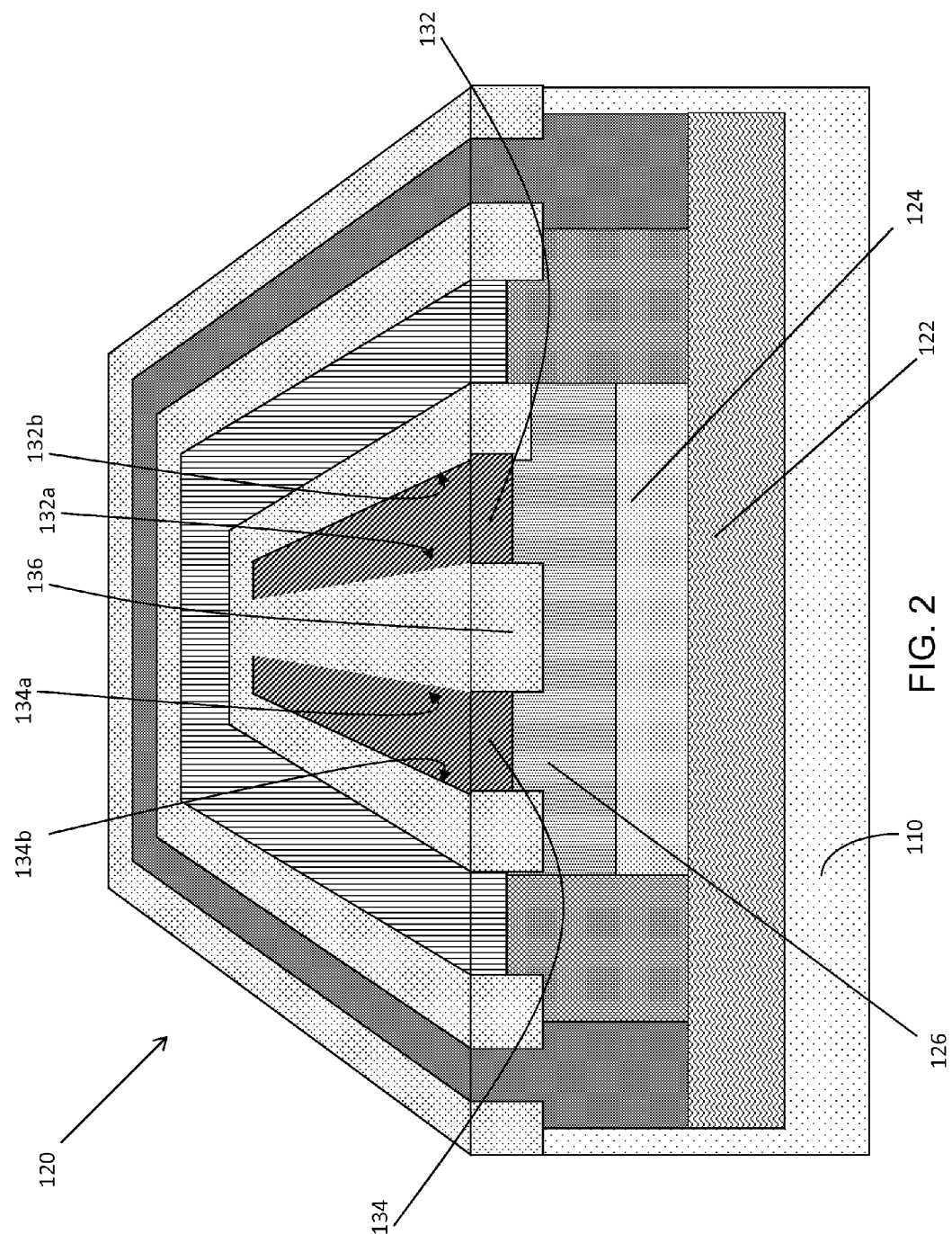
FIGS. 2-6 show various views of a JFET according to embodiments of the invention.

FIG. 2 shows a JFET 120 according to an embodiment of this invention. JFET 120 is incorporated into a substrate 110 of an IC chip (partially shown). As in JFET 20, JFET 120 includes a deep doped region 122, a lower gate 124 and a channel region 126. Again, the depth and width of each layer can be adjusted as desired. JFET 120 further includes a source region 132 having an upper surface substantially coplanar with the upper surface of JFET 120, the upper surface of source region 132 having an inner edge 132a and an outer edge 132b. JFET 120 further includes a drain region 134 having an upper surface substantially coplanar with the upper surface of JFET 120, the upper surface of drain region 134 having an inner edge 134a and an outer edge 134b.

However, in contrast to traditional JFETs, such as JFET 20 shown in FIG. 1, JFET 120 does not include an upper gate coplanar with the upper (top) surface of JFET 120. Instead, the region that is coplanar with the upper surface of JFET 120 between source region 132 and drain region 134 is a single STI region 136 that comprises insulator material and is not intentionally doped. In other words, a single, uninterrupted STI region 136 having an upper surface substantially coplanar with the upper surface of JFET 120, extends from inner edge 132a of source region 132 to inner edge 134a of drain region 134. As such, there is no upper gate, e.g., intentionally doped region, between inner edge 132a of source region 132 and inner edge 134a of drain region 134.

STI region 136 can comprise any now known or later developed insulator material, and can be formed by any commonly known technique for forming an isolation region, such as etching a pattern of trenches in the silicon, depositing one or more dielectric materials (such as silicon oxide) to fill the trenches, and removing the excess dielectric using a technique such as chemical-mechanical planarization.

Eliminating the upper gate and the additional STI regions on the upper surface of JFET 120 between source/drain regions 132, 134 can result in a reduction (about 50%) of the area required to form JFET 120, as compared to JFET 20. The configuration of JFET 120 shown in FIG. 2 can also reduce an effective channel length between source region 132 and drain region 134, which reduces the $R_{on}$ for JFET 120, as compared to JFET 20. STI region 136 can also help maintain a low pinch off voltage, $V_p$ (as compared to JFET 20) because STI region 136 provides a deep pedestal, or wedge, which decreases the vertical depletion distance required for lower gate 124 to pinch-off channel region 126.

Figure 3:
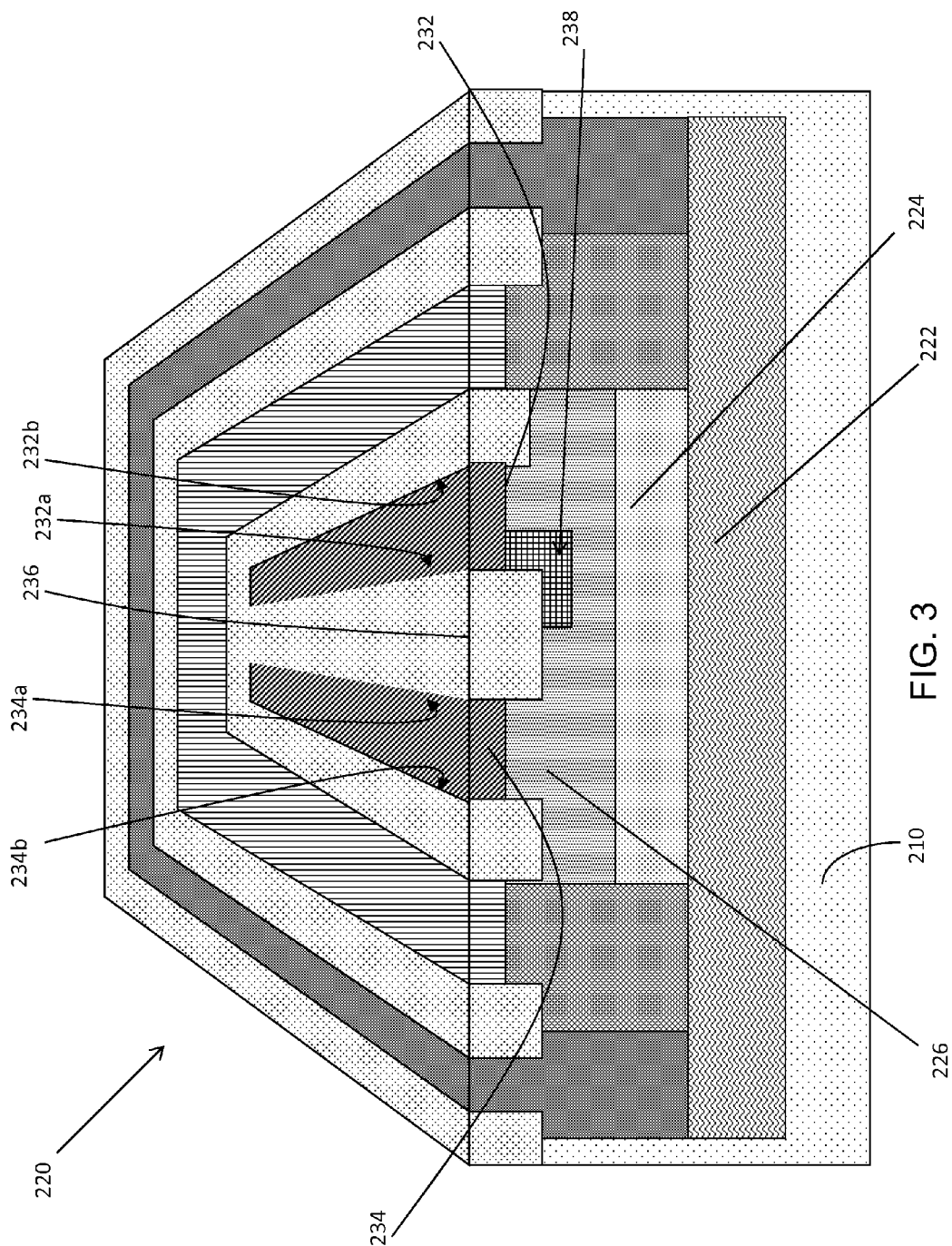

FIG. 3 shows a JFET 220 according to another embodiment of this invention. JFET 220 is similar to JFET 120 in that it includes a deep doped region 222, a lower gate 224 and a channel region 226. JFET 220 further includes a source region 232 having an upper surface substantially coplanar with the upper surface of JFET 220, the upper surface of source region 232 having an inner edge 232a and an outer edge 232b. JFET 220 further includes a drain region 234 having an upper surface substantially coplanar with the upper surface of JFET 220, the upper surface of drain region 234 having an inner edge 234a and an outer edge 234b.

Similar to JFET 120, JFET 220 does not include an upper gate coplanar with the upper (top) surface of JFET 220, and instead includes a single, uninterrupted STI region 236 with an upper surface substantially coplanar with the upper surface of JFET 120, wherein STI region 236 extends from inner edge 132a of source region 132 to inner edge 134a of drain region 134. As such, there is no upper gate, i.e., intentionally doped region between inner edge 132a of source region 132 and inner edge 134a of drain region 134.

STI region 236 can comprise any now known or later developed insulator material, and can be formed by any commonly known technique for forming an isolation region, such as etching a pattern of trenches in the silicon, depositing one or more dielectric materials (such as silicon oxide) to fill the trenches, and removing the excess dielectric using a technique such as chemical-mechanical planarization.

JFET 220 further includes an asymmetrical quasi-buried upper gate 238 in channel region 226. As illustrated in FIG. 3, quasi-buried upper gate 238 is disposed under STI region 236, not coplanar with an upper surface of JFET 220, as in traditional JFETs (see, e.g., JFET 20 shown in FIG. 1). Quasi-buried upper gate 238 can be asymmetric, e.g., it can be positioned only under a portion of STI region 236 which is proximate to source region 232, while not extending under a portion of STI region 236 which is proximate to drain region 234. Alternatively, as shown in FIG. 3, quasi-buried upper gate 238 can be positioned partially under STI region 236, and along a sidewall of STI region 236 proximate to source region 232.

Figure 4:
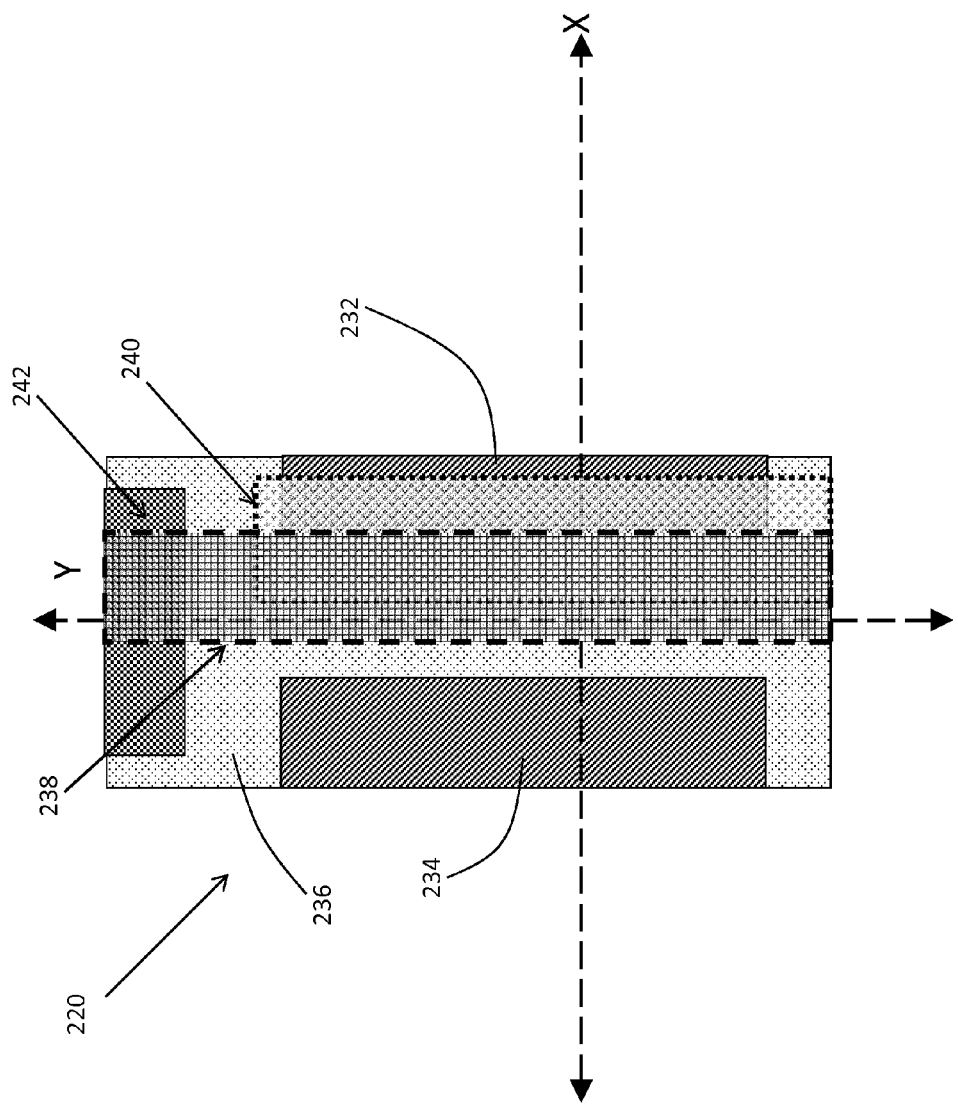

FIG. 4 further illustrates the position of quasi-buried upper gate 238, showing a top down view of JFET 220. As is shown, quasi-buried upper gate 238 extends partially under STI region 236, and partially under source region 232, but not under drain region 234. In other words, quasi-buried upper gate 238 is not only held off drain region 234, but also does not extend under a portion of STI region 236 that is proximate to drain region 234. Because quasi-buried upper gate 238 is deposited only under a portion of STI region 236, it is referred to as asymmetrical. As shown in FIG. 3, in one embodiment, quasi-buried upper gate 238 encroaches up a substantially vertical sidewall of STI region 236 proximate to source region 232, but not up a substantially vertical sidewall of STI region 236 proximate to drain region 234.

Figure 5:
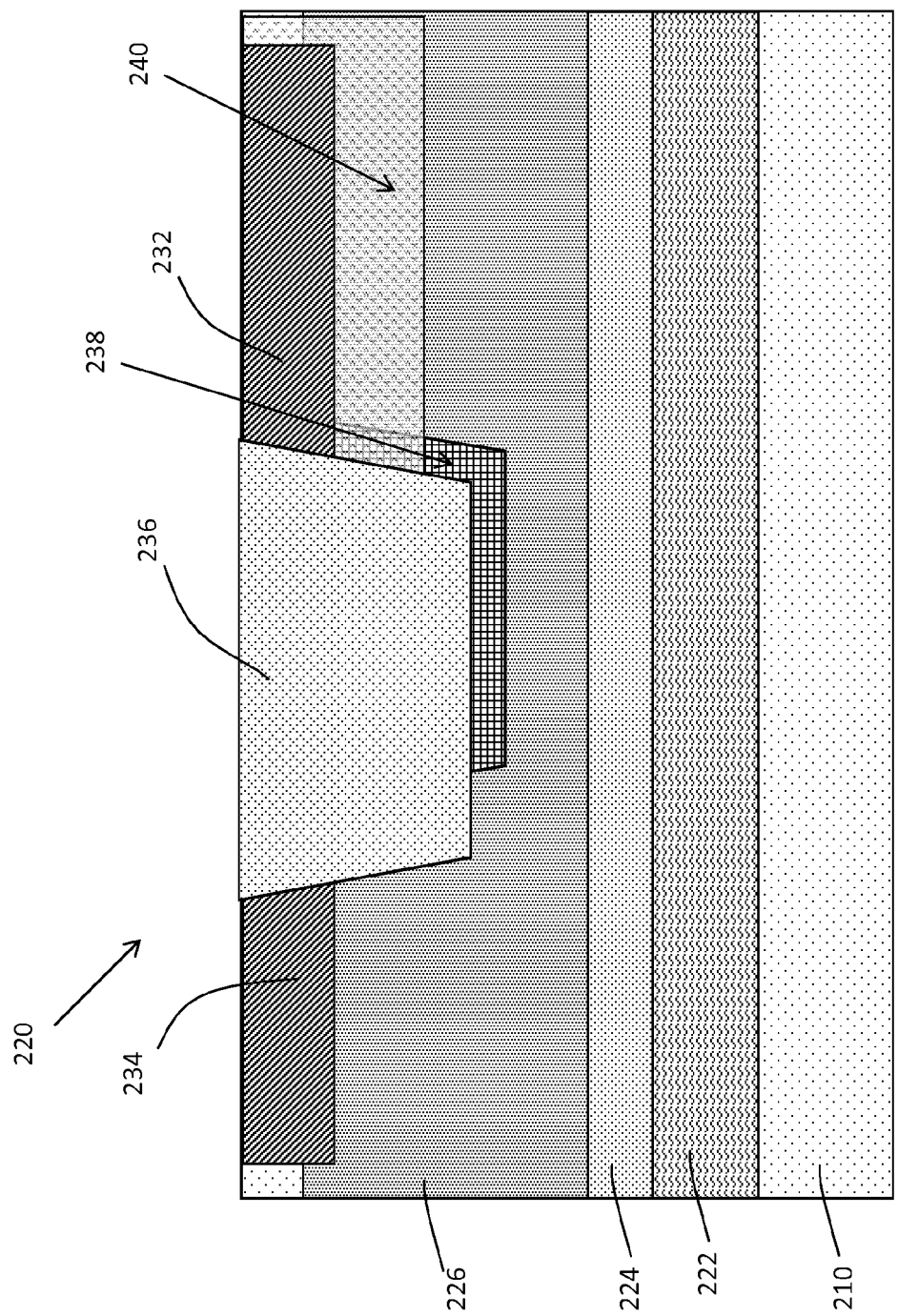

Excluding quasi-buried upper gate 228 from extending under the portion STI region 236 that is proximate to drain region 234 or under drain region 234, does not degrade the drain to gate ($V_{dg}$) breakdown voltage. FIG. 5 shows a cross-sectional view along the x-axis of FIG. 4, enlarged to better illustrate quasi-buried upper gate 238.

As shown in FIGS. 4 and 5, according to another embodiment of the invention, an implantation layer 240, e.g., to reduce $R_{on}$, can be included under source region 232. $R_{on}$ reduction implantation layer 240 is a higher n-doped portion of channel region 226 only under source region 232. $R_{on}$ reduction implantation layer 240 is considered higher doped because there are more n-type dopants located in this region than remaining channel region 226. The higher doped nature of implantation layer 240 will act to reduce the vertical series resistance from a surface of a contact (not shown) to source region 232 down to the bottom of STI region 236. This will effectively reduce $R_{on}$ for the entire JFET 220. A depth of implantation layer 240 can be modified as desired for a given $R_{on}$, source to gate ($V_{sg}$) breakdown voltage and source to gate parasitic capacitance ($C_{sg}$). In general, the deeper implantation layer 240 extends into JFET 220, the lower source region 232 series resistance will be, but the higher the $C_{sg}$ will be.

Figure 6:
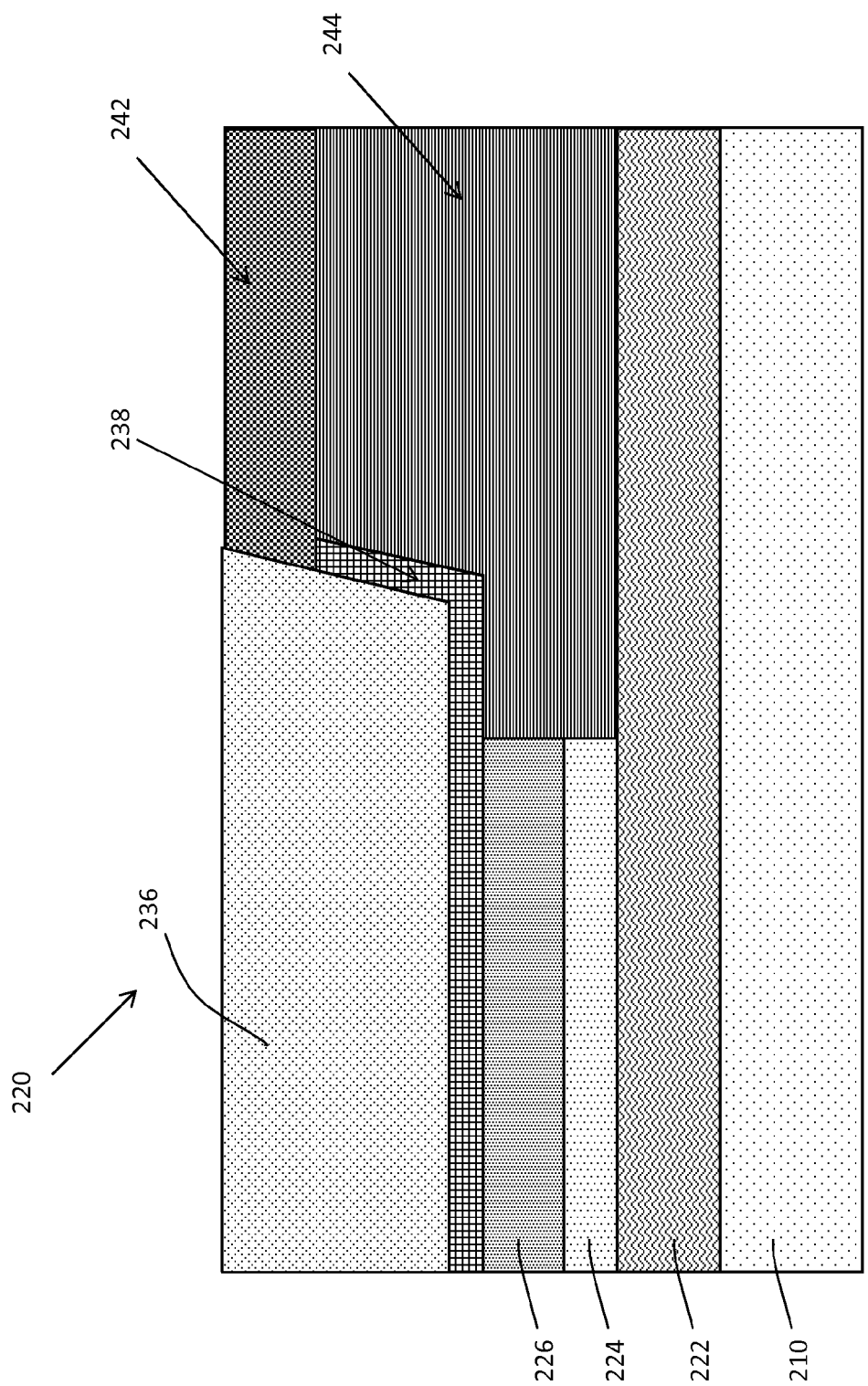

FIG. 6 shows a cross-sectional view along the y-axis of FIG. 4, enlarged to better illustrate quasi-buried upper gate 238. As FIG. 6 shows, a well/sidewall gate contact 244 can be formed as a reach-through contact to lower gate 224, and an upper gate contact 242 can be formed to contact quasi-buried upper gate 238. Contacts 242, 244 are similarly doped regions as quasi-buried upper gate 238 and lower gate 224. Upper gate contact 242 can be a highly doped region contacting a surface of substrate 210 and quasi-buried upper gate 238. FIG. 4 also shows upper gate contact 242 in a different view.

The term "doping" used herein refers to a process of intentionally introducing impurities into substrate to change its electrical properties, for example, by ion implantation, shown in the figures by a series of arrows. The term "highly doped" as used in connection with embodiments of this invention refers to commonly understood metal-oxide-semiconductor field effect transistor (MOSFET) source/drain implants, i.e., approximately 1E15 to 1E16 atoms/cm$^2$ or concentration of 1E20 to 1E21 atoms/cm$^3$ dopant concentration.

A method of forming JFET 220 is shown in FIGS. 7-24. The odd numbered drawings of FIGS. 7-24 (i.e. FIGS. 7, 9, 11, 13, 15, 17, 19, 21, and 23) show method steps along the x-axis of JFET 220 (FIG. 4), while the even numbered drawings of FIGS. 7-24 (i.e. FIGS. 8, 10, 12, 14, 16, 18, 20, 22, and 24) show method steps along the y-axis of JFET 220 (FIG. 4).

Figure 8:
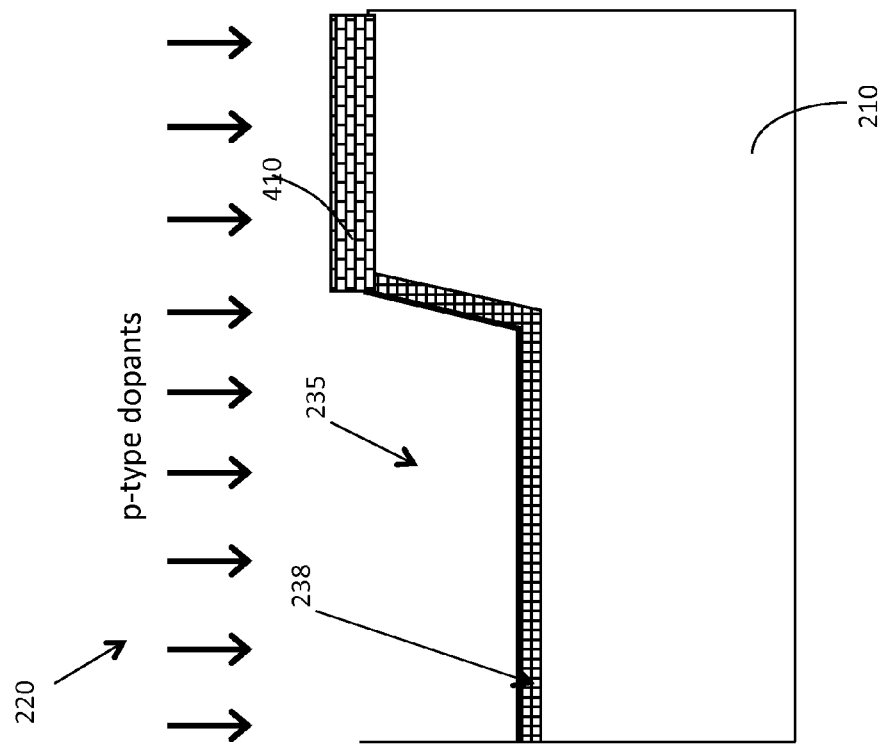
Figure 7:
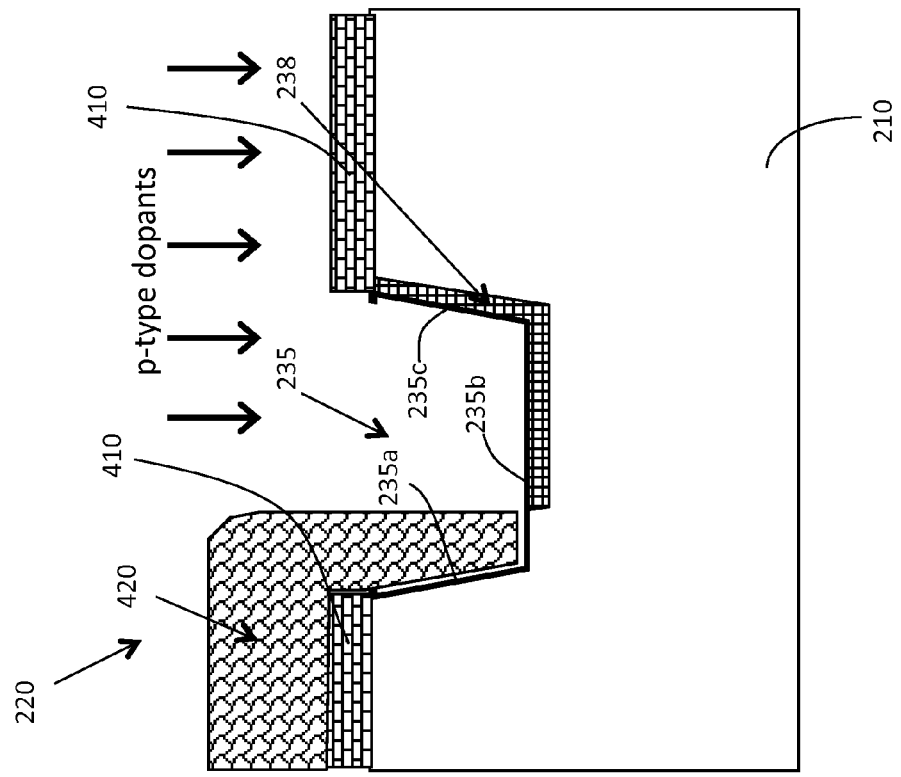

Turning to FIGS. 7 and 8, substrate 210 is provided (doped with p-type dopants in this example, but as it is understood that p-type and n-type dopants shown and discussed herein can be reversed). Substrate 210 can comprise any commonly used substrate material including but not limited to silicon, germanium, silicon germanium, silicon carbide, and those comprising essentially of one or more III-V compound semiconductors having a composition defined by the formula A1X1GaX2InX3AsY1PY2NY3SbY4, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition ZnA1CdA2SeB1TeB2, where A1, A2, B1, and B2 are relative proportions each greater than or equal to zero and A1+A2+B1+B2=1 (1 being a total mole quantity). Furthermore, a portion or an entire semiconductor substrate may be strained.

As shown in FIGS. 7 and 8, a trench 235 is etched in the surface of substrate 210 which will become shallow trench isolation (STI) region 236 (FIGS. 2-6). Trench 235 has a substantially horizontal bottom surface 235b, a substantially vertical source side 235c and a substantially vertical drain side 235a. P-type dopants are then implanted to create a p-type quasi-buried upper gate 238 under trench 235. As shown in FIG. 7, quasi-buried upper gate 238 extends only partially along bottom surface 235b of trench 235, i.e., quasi-buried upper gate 238 is not implanted along at least a portion of bottom surface 235b of trench 235 or along substantially vertical drain side 235a. Quasi-buried upper gate 238 can have a doped concentration in the range of 1E18 to 1E21 atom/cm$^3$. Quasi-buried upper gate 238 has a higher doped concentration than channel region 226 in order to over compensate and still maintain opposite polarity type from channel region 226.

As discussed herein, quasi-buried upper gate 238 is only under trench 235 (ultimately STI region 236) proximate to source region 232, and not proximate to drain region 234. For example, quasi-buried upper gate 238 can be included along only a portion of bottom surface 235b, and along only one sidewall of trench 235, i.e., substantially vertical source side 235c and not substantially vertical drain side 235a. Therefore, a mask, such as mask 410, can be applied to block certain areas adjacent to trench 235 from being implanted. For example, a photoresist material 420 can be used to block substantially vertical drain side 235a and a portion of bottom surface 235b of trench 235 from being implanted.

Mask 410 (and other masks discussed herein) can comprise a hard mask dielectric material, such as a combination of silicon oxide and nitride, commonly used during STI processing. During STI processing, mask 410 acts as hardmask protection during an RIE trench etch, but can also be used as a stop during chemical mechanical polishing (CMP) when planarizing the dielectric fill material for STI. This can be helpful for JFET processing because mask 410 provides a self aligned process which blocks the implant from a top surface of substrate 210 but allows the implant to go into a bottom of a trench, and possibly on the sidewalls depending on STI sidewall angle/profile and/or the angle of the implant.

Figure 10:
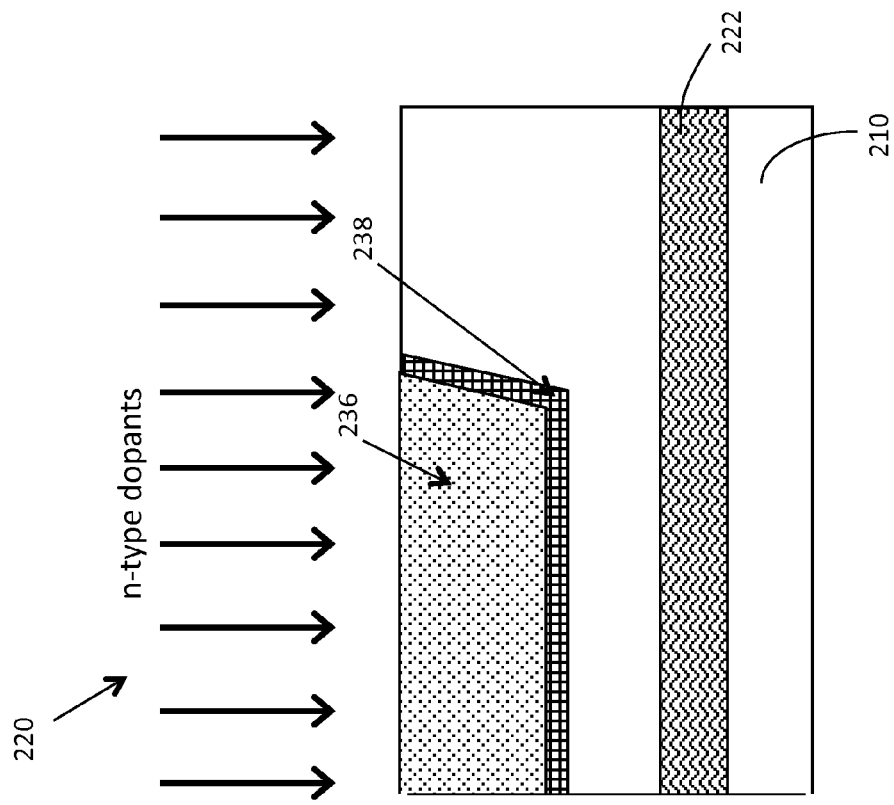
Figure 9:
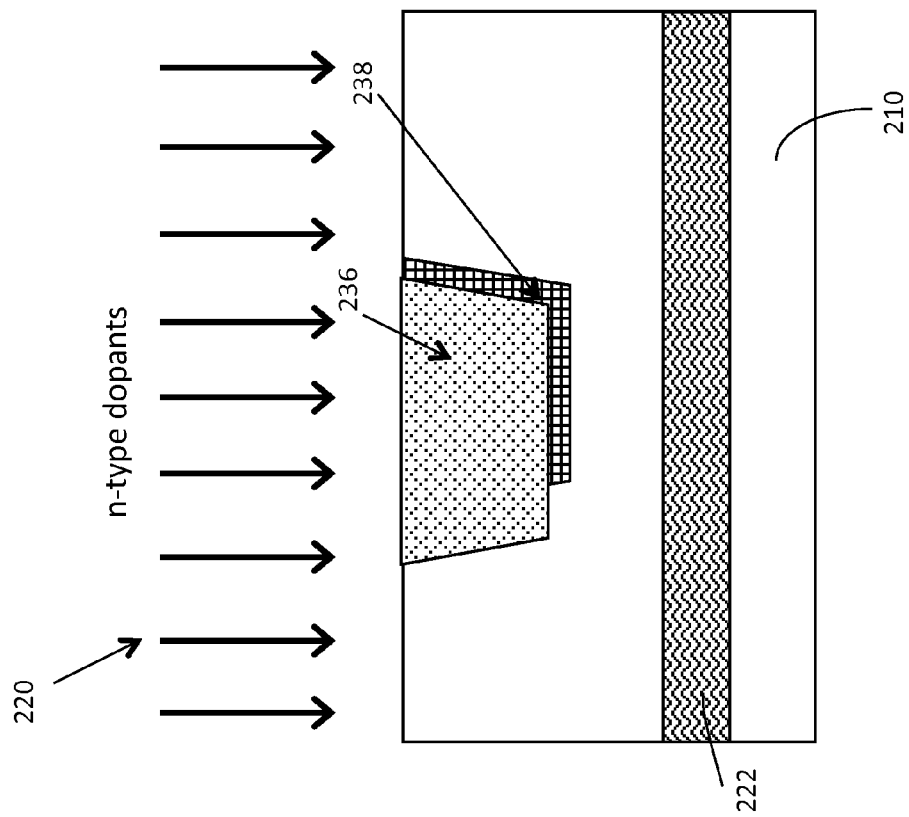

Once quasi-buried upper gate 238 has been formed, standard JFET processing can continue. For example, as shown in FIGS. 9 and 10, trench 236 is filled with isolation material to create STI region 236. STI region 236 can be formed by any commonly known technique for forming an isolation region, such as etching a pattern of trenches in the silicon, depositing one or more dielectric materials (such as silicon oxide) to fill the trenches, and removing the excess dielectric using a technique such as chemical-mechanical planarization. Commonly used insulating material can be used for STI region 236, i.e., any dielectric film that provides electrical isolation, including, but not limited to silicon oxide or silicon nitride and/or a combination of silicon oxide and silicon nitride.

N-type dopants are then implanted to form deep isolation layer 222. It is understood that deep isolation layer 222 is only needed for n-channel devices. Deep isolation layer 222 can be at any desired depth, as long as it is deep enough to allow regions (discussed herein) to be formed above layer 222 and under STI region 236.

Figure 12:
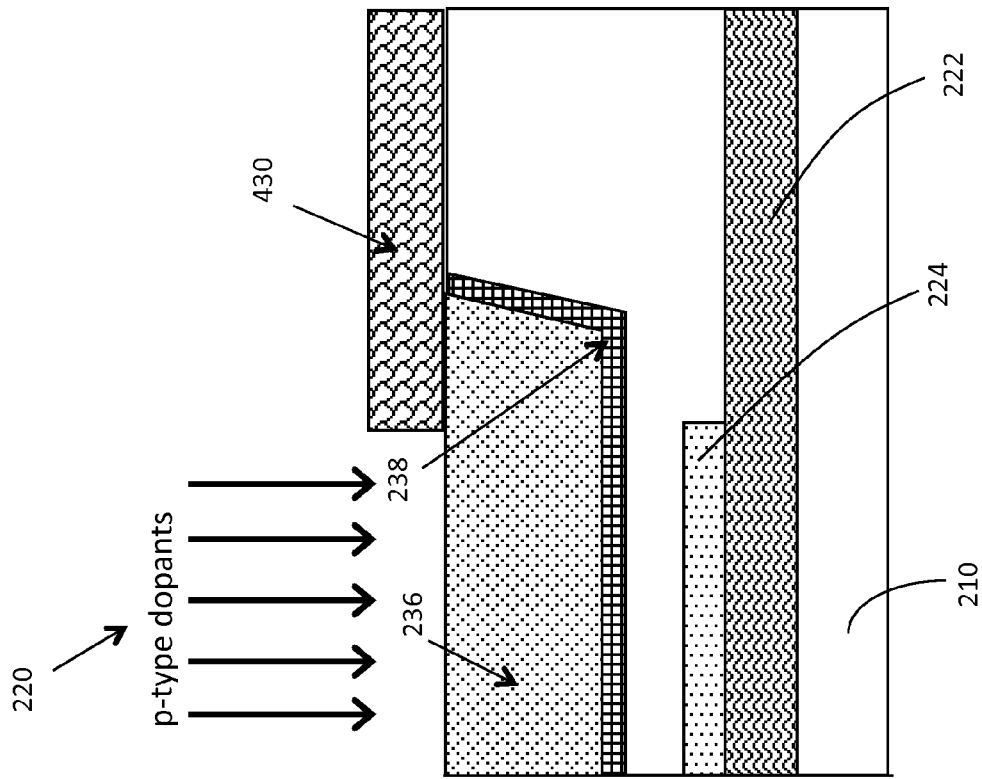
Figure 11:
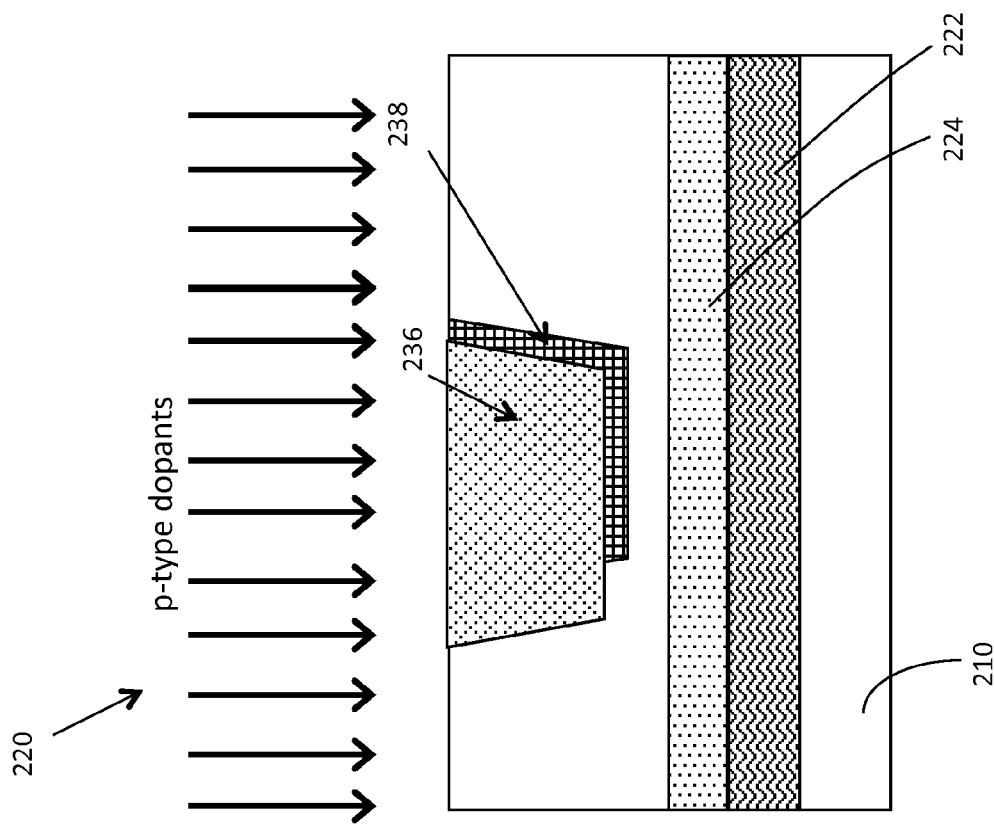

Next, as shown in FIGS. 11 and 12, a mask 430 is applied so that p-type dopants are implanted in the desired region to form lower gate 224. Implant dosage to form lower gate 224 can be in a range from 1E16 to 1E20 atom/cm$^3$. Then, as shown in FIGS. 13 and 14, a mask 440 is applied such that n-type dopants are implanted in the desired region to form channel region 226 surrounding STI region 236. In one embodiment, lower gate 224 is higher doped than channel region 226 in order to over compensate and still maintain opposite polarity type from channel region 226.

FIGS. 15 and 16 show the formation of well/sidewall gate contact 244 to contact lower gate 224. A mask 450 is applied to block the rest of the surface of JFET 220 while well/sidewall gate contact 244 is formed adjacent to STI region 236 by implanting p-type dopants. While only one well/sidewall gate contact 244 is shown in FIG. 16, it is understood that additional contacts can be formed to contact lower gate 224.

FIGS. 17 and 18 show the formation of implantation layer 240 to reduce $R_{on}$. $R_{on}$ reduction implantation layer 240 is a highly n-doped portion of channel region 226. A mask 460 is applied to ensure that $R_{on}$ reduction implantation layer 240 is formed on only one side of STI region 236, e.g., a side that will ultimately be under source region 232.

FIGS. 19 and 20 show the use of a mask 470 to create source region 232 and drain region 234, where both source region 232 and drain region 234 are adjacent to the same STI region 236. High dosed n-type dopants can be used to implant source region 232 and drain region 234, for example, implant dosage in a range from approximately 1E18 to 1E21 atom/$cm^3$, typically in range of approximately 1E20 to 1E21 atom/$cm^3$. Source region 232 and drain region 234 can therefore be higher doped than channel region 226.

Figures 21, 22:
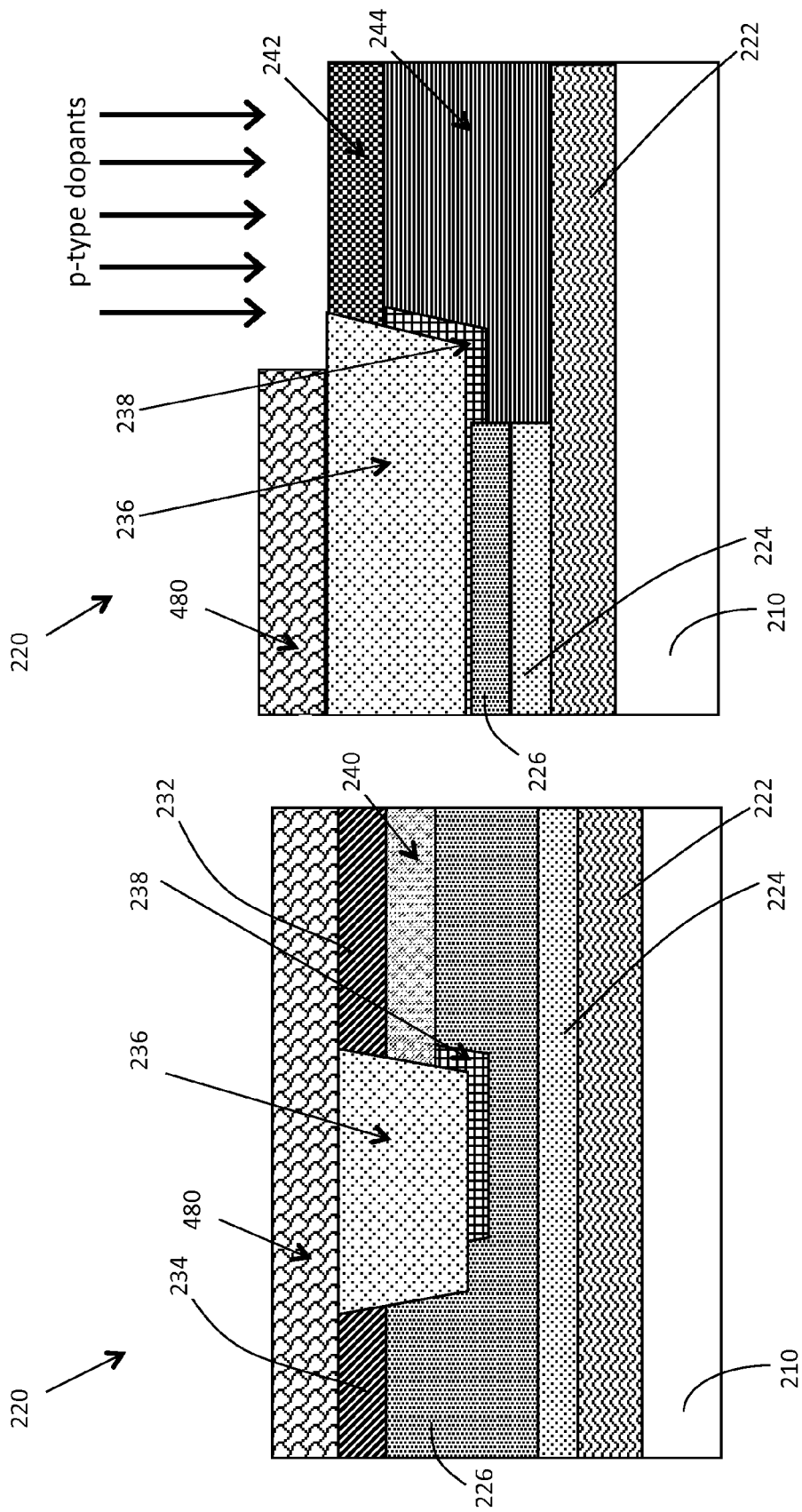

FIGS. 21 and 22 show the formation of upper gate contact 242 for contacting quasi-buried upper gate 238. A mask 480 is applied to create upper gate contact 242 as desired. High dosed p-type dopants can be used to implant upper gate contact 242, i.e., implant dosage in a range from approximately 1E18 to 1E21 atom/$cm^3$, typically in range of approximately 1E20 to 1E21 atom/$cm^3$.

FIGS. 23 and 24 show a layer of silicide 246 formed over source region 232, drain region 234, and gate contact region 242 so that standard metallization processes can occur and have desirable ohmic contact down to substrate surface regions. Silicide layer 246 may be formed using any now known or later developed technique, e.g., depositing a metal such as titanium, nickel, cobalt, etc., annealing to have the metal react with silicon, and removing unreacted metal.

Spacers and source/drain extensions can also be formed. Again, these spacers and source/drain extensions are not shown in the figures, as it is not necessary for illustrating the embodiments of this invention, but it is understood that the inclusion of spacers and source/drain extensions is commonly known in the art when working with MOSFET devices.

It is also understood that several diffusion or annealing steps can be performed throughout the process discussed above, as would be understood by one of ordinary skill in the art. Such diffusion or annealing steps would be performed to smooth out the layers and regions discussed herein and to drive in the dopants to ensure that the layers are effective and dopants are electrically active.

While FIGS. 7-24 show methodology to form JFET 220 with no upper gate coplanar with the upper surface of JFET 220, quasi-buried upper gate 238 and $R_{on}$ reduction implantation layer 240, it is understood that a similar process could be performed to form JFET 220 with no upper gate coplanar with the upper surface of JFET 220, no quasi-buried upper gate, and with no $R_{on}$ reduction implantation layer. In addition, similar methodology can be employed to form JFET 220 with no upper gate coplanar with the upper surface of JFET 220, no $R_{on}$ reduction implantation layer, but including quasi-buried upper gate 238.

As used herein, the term "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser-assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

It is also understood that when discussing p-type and n-type doping herein, the polarities can be reversed from what is disclosed, as long as adjacent layer are intentionally doped with an opposite polarity in order to ensure that there is little to no conduction between the layers.

Figure 25:
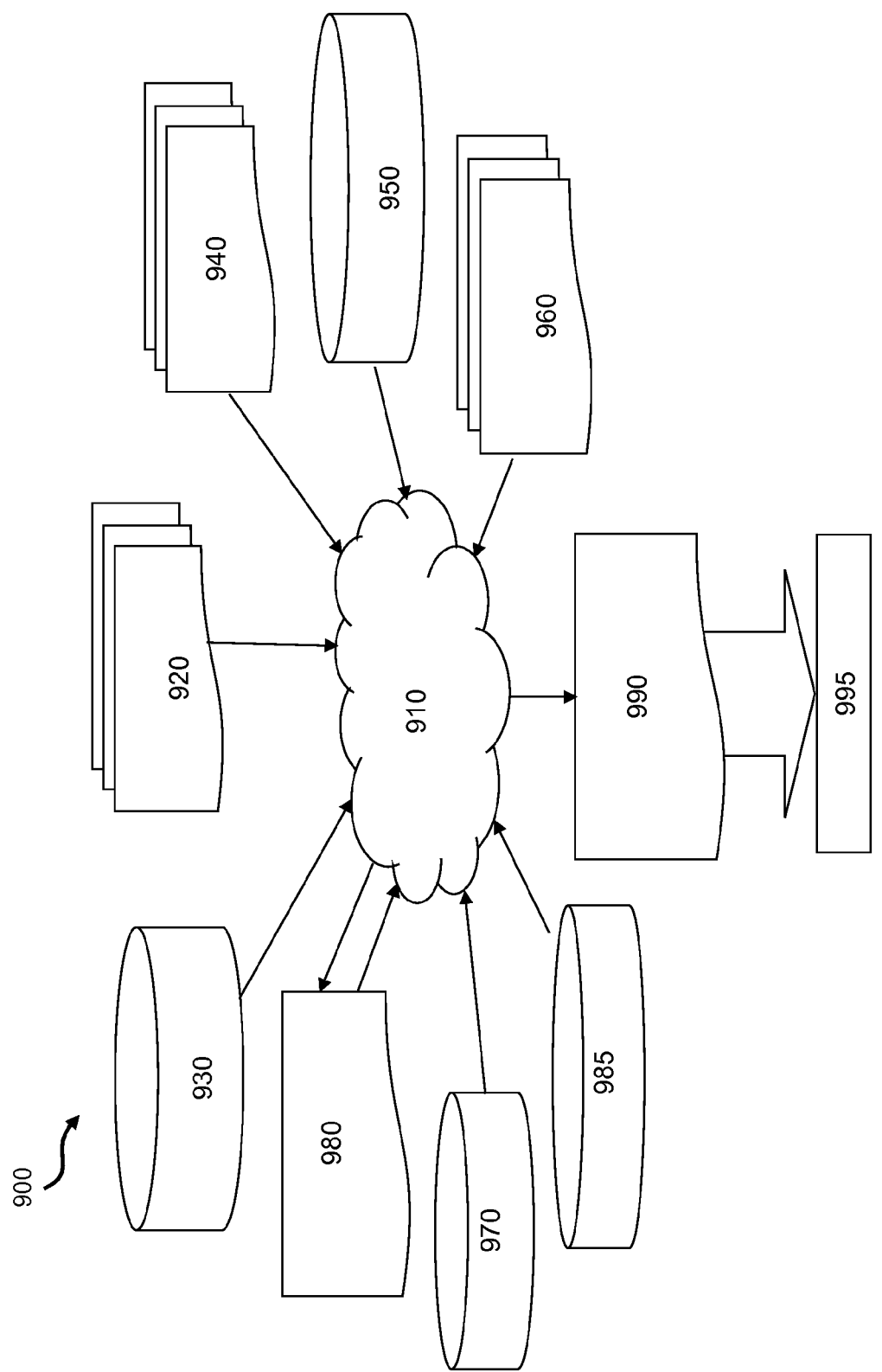
FIG. 25 is a flow diagram of a design process used in semiconductor design, manufacture, and/or test.

FIG. 25 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 2-6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 25 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-6. In one embodiment, design structure 990 may comprise a compiled, executable HDL simulation model that functionally simulates the devices shown in FIGS. 2-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-6. Design structure 990 may then proceed to a stage 995 where, for example, design structure 990: proceeds to tape-out, is released to manufacturing, is released to a mask house, is sent to another design house, is sent back to the customer, etc.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A junction field effect transistor (JFET) having an upper surface, the JFET comprising:
   a source region having an upper surface substantially coplanar with the upper surface of the JFET, the upper surface of the source region having an inner edge and an outer edge;
   a drain region having an upper surface substantially coplanar with the upper surface of the JFET, the upper surface of the drain region having an inner edge and an outer edge;
   a channel region disposed under the source region and the drain region;
   a shallow trench isolation (STI) region comprising an insulator material, the STI region having an upper surface substantially coplanar with the upper surface of the JFET, the upper surface of the STI region extending from the inner edge of the source region to the inner edge of the drain region; and
   a quasi-buried upper gate disposed in the channel region, the quasi-buried upper gate positioned partially under the STI region,
   wherein the quasi-buried upper gate does not extend under a portion of the STI region proximate to the drain region, and wherein the quasi-buried upper gate extends at least partially along a substantially vertical sidewall of the STI region proximate to the source region.

2. The JFET of claim 1, further comprising an implantation layer within the channel region, the implantation layer positioned only under the source region, and wherein the implantation layer is doped.

3. The JFET of claim 2, wherein the channel region includes dopants and the implantation layer includes a higher concentration of dopants than the channel region.

4. The JFET of claim 2, wherein the concentration of dopants in the implantation layer is in the range of approximately 1E15 atoms/cm$^3$ to approximately 1E21 atoms/cm$^3$.

5. The JFET of claim 1, further comprising a quasi-buried upper gate contact to the quasi-buried upper gate, wherein the quasi-buried upper gate contact has a higher concentration of dopants than the source region.

6. The JFET of claim 1, further comprising an implantation layer within the channel region, the implantation layer positioned only under the source region, and wherein the implantation layer includes n-type dopants.

7. The JFET of claim 6, wherein the channel region includes n-type dopants and the implantation layer has a higher concentration of n-type dopants than the channel region.

8. A final design structure instantiated in a machine readable medium for designing and manufacturing a circuit, the final design structure comprising machine readable instructions for manufacturing at least one circuit and an integrated circuit, the circuit comprising:
   a junction field effect transistor (JFET) including:
   a source region having an upper surface substantially coplanar with the upper surface of the JFET, the upper surface of the source region having an inner edge and an outer edge;
   a drain region having an upper surface substantially coplanar with the upper surface of the JFET, the upper surface of the drain region having an inner edge and an outer edge;
   a channel region disposed under the source region and the drain region;
   a shallow trench isolation (STI) region comprising an insulator material, the STI region having an upper surface substantially coplanar with the upper surface of the JFET, the STI region extending from the inner edge of the source region to the inner edge of the drain region; and
   a quasi-buried upper gate disposed in the channel region, the quasi-buried upper gate positioned partially under the STI region,
   wherein the quasi-buried upper gate does not extend under a portion of the STI region proximate to the drain region, and wherein the quasi-buried upper gate extends at least partially along a substantially vertical sidewall of the STI region proximate to the source region.

9. The final design structure of claim 8, wherein the final design structure comprises a netlist, which describes the circuit.

10. The final design structure of claim 8, wherein the final design structure resides on a GDS storage medium.

11. The final design structure of claim 8, wherein the final design structure includes test data files, characterization data, verification data, or design specifications.

12. The final design structure of claim 8, wherein the JFET further includes an implantation layer within the channel region, the implantation layer positioned only under the source region, and wherein the implantation layer is doped.

13. The final design structure of claim 12, wherein the channel region includes dopants and the implantation layer includes a higher concentration of dopants than the channel region.

14. The final design structure of claim 12, wherein the concentration of dopants in the implantation layer is in the range of approximately 1E15 atoms/cm$^3$ to approximately 1E21 atoms/cm$^3$.

15. The final design structure of claim 8, further comprising a quasi-buried upper gate contact to the quasi-buried upper gate, wherein the quasi-buried upper gate contact has a higher concentration of dopants than the source region.

16. The final design structure of claim 8, further comprising an implantation layer within the channel region, the implantation layer positioned only under the source region, and wherein the implantation layer includes n-type dopants.

17. The final design structure of claim 16, wherein the channel region includes n-type dopants and the implantation layer has a higher concentration of n-type dopants than the channel region.

* * * * *